United States Patent
Dordi et al.

(10) Patent No.: US 7,704,367 B2
(45) Date of Patent: Apr. 27, 2010

(54) METHOD AND APPARATUS FOR PLATING SEMICONDUCTOR WAFERS

(75) Inventors: Yezdi Dordi, Palo Alto, CA (US); Bob Maraschin, Cupertino, CA (US); John Boyd, Atascadero, CA (US); Fred C. Redeker, Fremont, CA (US); Carl Woods, Aptos, CA (US)

(73) Assignee: Lam Research Corporation, Fremont, CA (US)

(*) Notice: Subject to any disclaimer, the term of this patent is extended or adjusted under 35 U.S.C. 154(b) by 1212 days.

(21) Appl. No.: 10/879,263

(22) Filed: Jun. 28, 2004

(65) Prior Publication Data

US 2005/0284767 A1     Dec. 29, 2005

(51) Int. Cl.
C25D 7/12       (2006.01)
H01L 21/288   (2006.01)
B23H 7/26       (2006.01)
C25B 11/00     (2006.01)

(52) U.S. Cl. .................. 205/157; 205/123; 205/654; 204/280

(58) Field of Classification Search .......... 204/224, 204/280; 438/689; 205/157, 123, 654
See application file for complete search history.

(56) References Cited

U.S. PATENT DOCUMENTS

| | | | |
|---|---|---|---|
| 5,660,642 A | 8/1997 | Britten | |
| 6,090,711 A * | 7/2000 | Batz et al. | 438/689 |
| 6,495,005 B1 | 12/2002 | Colgan et al. | |
| 6,660,137 B2 * | 12/2003 | Wilson et al. | 204/224 R |
| 6,746,589 B2 * | 6/2004 | Mishima et al. | 205/98 |
| 6,852,208 B2 * | 2/2005 | Ashjaee et al. | 205/137 |
| 2002/0070126 A1 * | 6/2002 | Sato et al. | 205/640 |
| 2002/0084189 A1 * | 7/2002 | Wang et al. | 205/98 |
| 2002/0121290 A1 | 9/2002 | Tang et al. | |
| 2002/0125212 A1 | 9/2002 | Mertens et al. | |
| 2003/0102226 A1 * | 6/2003 | Gabe et al. | 205/263 |
| 2004/0020781 A1 * | 2/2004 | Dordi et al. | 205/143 |
| 2004/0178060 A1 * | 9/2004 | Ravkin et al. | 204/232 |

FOREIGN PATENT DOCUMENTS

| | | |
|---|---|---|
| EP | 0905746 A1 | 3/1999 |
| WO | WO-99/16109 A1 | 4/1999 |
| WO | WO-02/101795 A2 | 12/2002 |

* cited by examiner

*Primary Examiner*—Jennifer K Michener
*Assistant Examiner*—Dustin Q Dam
(74) *Attorney, Agent, or Firm*—Martine Penilla & Gencarella, LLP

(57) ABSTRACT

First and second electrodes are disposed at first and second locations, respectively, proximate to a periphery of a wafer support, wherein the first and second location are substantially opposed to each other relative to the wafer support. Each of the first and second electrodes can be moved to electrically connect with and disconnect from a wafer held by the wafer support. An anode is disposed over and proximate to the wafer such that a meniscus of electroplating solution is maintained between the anode and the wafer. As the anode moves over the wafer from the first location to the second location, an electric current is applied through the meniscus between the anode and the wafer. Also, as the anode is moved over the wafer, the first and second electrodes are controlled to connect with the wafer while ensuring that the anode does not pass over an electrode that is connected.

23 Claims, 7 Drawing Sheets

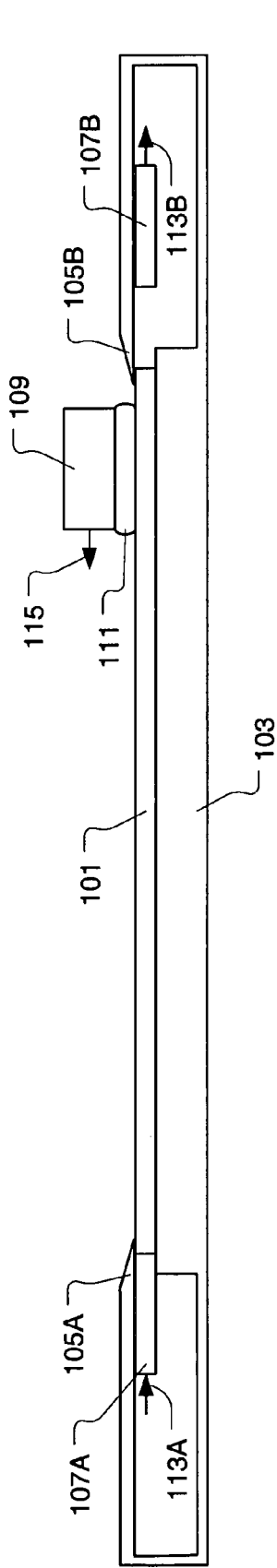
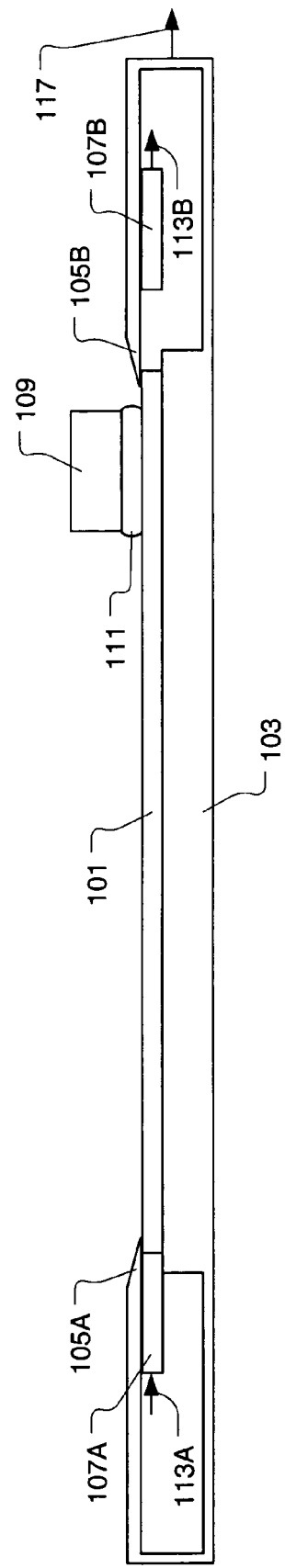
Fig. 1A
Fig. 1B

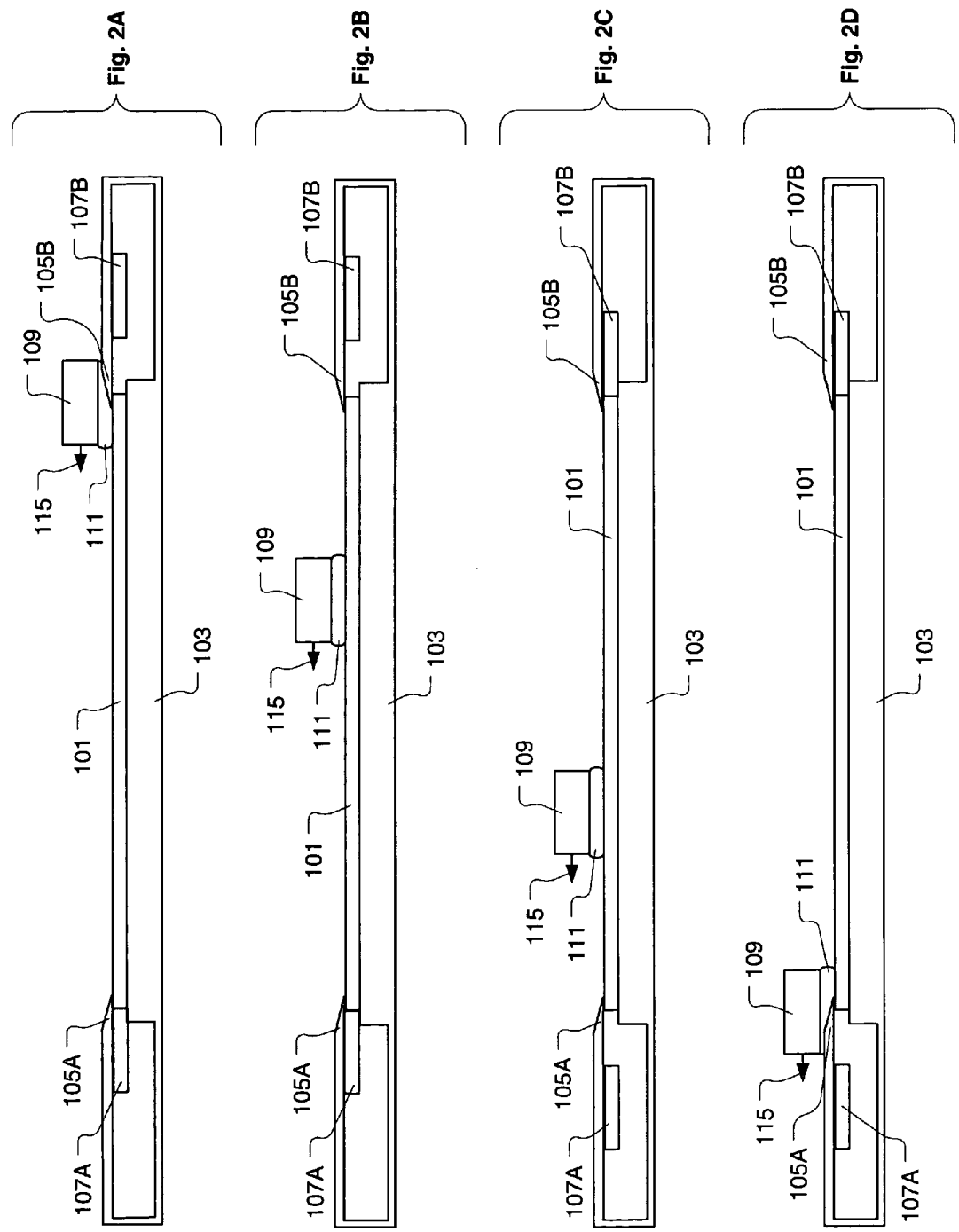

METHOD AND APPARATUS FOR PLATING SEMICONDUCTOR WAFERS

CROSS REFERENCE TO RELATED APPLICATIONS

This application is related to U.S. patent application Ser. No. 10/879,396, filed on even date herewith, and entitled "Electroplating Head and Method for Operating the Same." The disclosure of this related application is incorporated herein by reference.

BACKGROUND OF THE INVENTION

1. Field of the Invention

The present invention relates to semiconductor fabrication.

2. Description of the Related Art

In the fabrication of semiconductor devices such as integrated circuits, memory cells, and the like, a series of manufacturing operations are performed to define features on semiconductor wafers. The semiconductor wafers include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

The series of manufacturing operations for defining features on the semiconductor wafers can include an electroplating process for adding material to the surface of the semiconductor wafer. Conventionally, electroplating is performed in a complete wafer electroplating processor with the entire wafer submerged in an electrolyte. During the conventional electroplating process, the wafer is maintained at a negative potential with respect to a positively charged anode plate, wherein the anode plate is substantially equal in size to the wafer. The anode plate is also submerged in the electrolyte and maintained in a position proximate to and parallel with the wafer.

During the plating process the wafer acts as a cathode. Thus, the wafer is required to be electrically connected to a number of electrodes. The number of electrodes are required to be uniformly distributed around a perimeter of the wafer and have substantially matched contact resistances in order to achieve a uniform current distribution across the wafer. In the complete wafer electroplating processor, a non-uniform current distribution across the wafer can result in a non-uniform plating thickness across the wafer.

While the conventional complete wafer electroplating processor is capable of depositing material on the surface of the wafer, there is an ever present need to continue researching and developing improvements in electroplating technology applicable to material deposition during semiconductor wafer fabrication.

SUMMARY OF THE INVENTION

In one embodiment, an apparatus for electroplating a semiconductor wafer is disclosed. The apparatus includes a wafer support configured to hold a wafer. The apparatus also includes a first electrode disposed at a first location that is proximate to a periphery of the wafer support. The first electrode can be moved to electrically connect with and disconnect from the wafer to be held by the wafer support. The apparatus also includes a second electrode disposed at a second location that is proximate to the periphery of the wafer support. The second location is substantially opposite from the first location relative to the wafer support. The second electrode can be moved to electrically connect with and disconnect from the wafer to be held by the wafer support. The apparatus further includes an anode configured to be disposed over an upper surface of the wafer to be held by the wafer support. The anode includes a rectangular surface area defined to be substantially parallel with and proximate to an upper surface of the wafer. The rectangular surface area has a long dimension that is at least equal to a diameter of the wafer. The rectangular surface area is further defined by a second dimension that is less than the diameter of the wafer. Additionally, the anode and the wafer support are configured to move with respect to one another in a direction extending between the first electrode and the second electrode, such that the anode can traverse over an entirety of the upper surface of the wafer when the wafer is held by the wafer support.

In another embodiment, an apparatus for electroplating a semiconductor wafer is disclosed. The apparatus includes a wafer support configured to hold a wafer. The apparatus also includes a first electrode disposed at a first location proximate a periphery of the wafer support, such that the first location resides along a first peripheral half of the wafer support. The first electrode is also movably configured to electrically contact the wafer to be held by the wafer support. The apparatus further includes a second electrode disposed at a second location proximate to the periphery of the wafer support, such that the second location resides along a second peripheral half of the wafer support. The second peripheral half of the wafer support is exclusive of the first peripheral half of the wafer support. The second electrode is also movably configured to electrically contact the wafer to be held by the wafer support. Additionally, the apparatus includes an anode configured to be disposed over an upper surface of the wafer to be held by the wafer support. The anode has a rectangular surface area defined to be substantially parallel with and proximate to an upper surface of the wafer. The rectangular surface area has a long dimension that is at least equal to a diameter of the wafer and a second dimension that is less than the diameter of the wafer. Furthermore, the anode and the wafer support are configured to move with respect to one another in a direction extending between the first electrode and the second electrode, such that the anode can traverse over an entirety of the upper surface of the wafer when the wafer is held by the wafer support.

In another embodiment, a semiconductor wafer electroplating system is disclosed. The system includes a wafer support structure defined to hold a wafer. The system also includes an anode configured to traverse over the wafer support structure from a first location to a second location. Each of the first location and the second location is proximate to and outside a periphery of the wafer support structure. The anode is further configured to contact a meniscus of electroplating solution between a horizontal surface of the anode and an upper surface of the wafer when being held by the wafer support structure. The horizontal surface of the anode has a rectangular area extending along a first chord defined across the wafer to be held by the wafer support structure. Also, the first chord is substantially perpendicular to a second chord extending from the first location to the second location. The system further includes a first electrode movably configured to electrically contact the wafer at a first contact position substantially near the first location when the wafer is being held by the wafer support structure. Additionally, the system includes a second electrode movably configured to electrically contact the wafer at a second contact position substantially near the second location when the wafer is being held by the wafer support structure.

In another embodiment, a method for electroplating a semiconductor wafer is disclosed. The method includes an operation for applying a first electrode to a wafer at a first location. The method also includes traversing an anode over an upper surface of the wafer from a second location toward the first location. The second location is opposed to the first location relative to a centerline extending across the upper surface of the wafer. An operation is also performed to establish a meniscus of electroplating solution between the anode and the upper surface of the wafer. Establishment of the meniscus allows an electrical current to flow through the meniscus between the anode and the first electrode. The method further includes an operation for applying a second electrode to the wafer at the second location when the anode has traversed the upper surface of the wafer a sufficient distance from the second location. Applying the second electrode to the wafer allows the electrical current to flow through the meniscus between the anode and the second electrode. After applying the second electrode to the wafer, the method includes another operation for removing the first electrode from the wafer. The method continues with an operation for completing traversal of the anode over the upper surface of the wafer.

Other aspects and advantages of the invention will become more apparent from the following detailed description, taken in conjunction with the accompanying drawings, illustrating by way of example the present invention.

BRIEF DESCRIPTION OF THE DRAWINGS

The invention, together with further advantages thereof, may best be understood by reference to the following description taken in conjunction with the accompanying drawings in which:

FIG. 1A is an illustration showing an apparatus for electroplating a semiconductor wafer, in accordance with one embodiment of the present invention;

FIG. 1B is an illustration showing an apparatus for electroplating a semiconductor wafer, in accordance with another embodiment of the present invention;

FIGS. 2A through 2D represent a sequence of illustrations showing operation of the apparatus for electroplating a semiconductor wafer as previously described with respect to FIG. 1A, in accordance with one embodiment of the present invention;

DETAILED DESCRIPTION

Figure 3A:
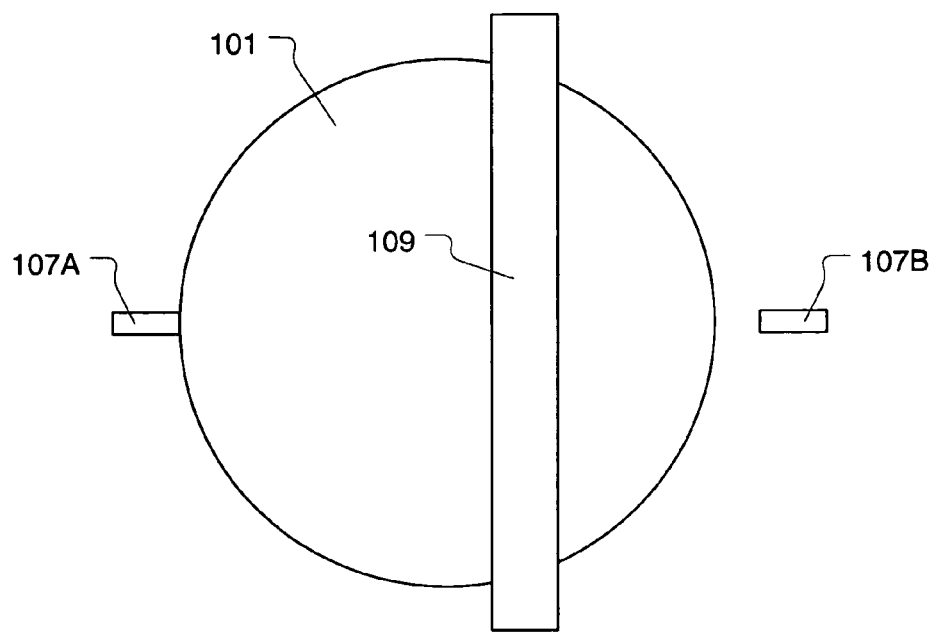
FIG. 3A is an illustration showing a top view of the anode relative to the first electrode, the second electrode, and the wafer, as previously depicted in FIG. 2B.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

FIG. 1A is an illustration showing an apparatus for electroplating a semiconductor wafer, in accordance with one embodiment of the present invention. The apparatus includes a wafer support 103 configured to securely hold a wafer 101. The apparatus also includes a first electrode 107A and a second electrode 107B. Each of the first electrode 107A and the second electrode 107B is located proximate to a periphery of the wafer support 103. Additionally, the second electrode 107B is located at a position that is substantially opposite from the first electrode 107A relative to the wafer support 103. In one embodiment, the first electrode 107A is disposed at a first position near the periphery of the wafer support 103, such that the first position resides along a first peripheral half of the wafer support. Also, in the same embodiment, the second electrode 107B is disposed at a second position near the periphery of the wafer support 103, such that the second position resides along a second peripheral half of the wafer support 103 that is exclusive of the first peripheral half of the wafer support 103.

Each of the first electrode 107A and the second electrode 107B is configured to be moved to electrically connect to and disconnect from the wafer 101 as indicated by arrows 113A and 113B, respectively. It should be appreciated that the movement of the electrodes 107A and 107B to connect with and disconnect from the wafer 101 can be conducted in an essentially limitless number of ways. For example, in one embodiment, the electrodes 107A and 107B can be moved linearly in a plane aligned with the wafer. In another embodiment, the electrodes 107A and 107B having a sufficient elongated shape and being oriented in a coplanar arrangement with the wafer 101 can be moved in a rotational manner to contact the wafer. Also, it should be appreciated that the shape of the electrodes 107A and 107B can be defined in a number of different ways. For example, in one embodiment, the electrodes 107A and 107B can be substantially rectangular in shape. In other embodiment, the electrodes 107A and 107B can be rectangular in shape with the exception of a wafer contacting edge which can be defined to follow a curvature of the wafer periphery. In yet another embodiment, the electrodes 107A and 107B can be C-shaped. It should be understood, that the present invention requires at least two electrodes that can be independently manipulated to electrically connect with and disconnect from a wafer.

The apparatus of FIG. 1A further includes an anode 109 configured to be disposed over an upper surface of the wafer 101. In one embodiment, a horizontal surface of the anode facing the wafer 101 is defined to have a substantially rectangular surface area that is considerably parallel to the wafer 101. The rectangular surface area is defined to have a first dimension that is at least equal to a diameter of the wafer.

With respect to the view shown in FIG. 1A, the first dimension of the rectangular surface area extends into the page. The rectangular surface area also includes a second dimension that is defined to be less than the diameter of the wafer. In one embodiment, the second dimension is substantially less than the diameter of the wafer. With respect to the view shown in FIG. 1A, the second dimension of the rectangular surface area extends at a right angle to the first dimension and parallel to the wafer support 103. When the anode 109 is disposed over the wafer 101, the first dimension, i.e., the long dimension, of the rectangular surface area extends along a first chord defined across the wafer 101, such that the anode 109 extends completely across the wafer in the direction of the first chord. Also, the second dimension, i.e., the short dimension, of the rectangular surface area extends in a direction of a second chord defined across the wafer 101, wherein the second chord is perpendicular to the first chord. It should be understood that regardless of the position of the anode 109 over the wafer 101, the anode 109 will not completely extend across the wafer in the direction of the second chord.

The anode 109 is configured to be moved over the wafer 101 in a direction extending between the second electrode 107B and the first electrode 107A as indicated by arrow 115. Thus, the anode 109 is configured to be moved in the direction of the second chord as previously described. As the anode 109 is moved over the wafer 101, the anode 109 is oriented such that the first dimension, i.e., the longer dimension, of the rectangular surface area facing the wafer is substantially perpendicular to the direction of travel. Therefore, the anode 109 is capable of traversing over an entirety of the upper surface of the wafer 101. Also, as the anode 109 is moved over the wafer 101, the rectangular surface area of the anode 109 is maintained at a distance proximate to an upper surface of the wafer 101.

The distance between the rectangular surface area of the anode 109 and the wafer 101 is sufficient to allow a meniscus 111 of electroplating solution to be maintained between the anode 109 and the upper surface of the wafer 101 as the anode 109 traverses over the wafer 101. Additionally, the meniscus 111 can be contained within a volume directly below the anode 109. Containment of the meniscus can be accomplished in a variety of ways as will be discussed later. In one embodiment, the anode 109 is represented as a solid consumable anodic material. In this embodiment, the meniscus 111 of electroplating solution can be applied to the volume directly below the anode 109 by flowing the electroplating solution around the anode 109. This embodiment is further described below with respect to FIGS. 4A and 4B. In another embodiment, the anode 109 is defined as a virtual anode represented as a porous resistive material. In this embodiment, the meniscus 111 of electroplating solution can be applied to the volume directly below the virtual anode by flowing cation laden electroplating solution through the porous virtual anode. This embodiment is further described below with respect to FIGS. 5A and 5B.

It should be appreciated that during operation of the apparatus of FIG. 1A, the anode 109 and at least one of the first and second electrodes 107A/107B are electrically connected to a power supply such that a voltage potential exists therebetween. Thus, when the meniscus 111 of electroplating solution is present between the anode 109 and the wafer 101, and either the first electrode 107A or the second electrode 107B is electrically connected to the wafer 101, an electric current will flow between the anode 109 and the connected electrode. The electric current flowing between the anode 109 and the connected electrode, i.e., 107A and/or 107B, enables electroplating reactions to occur at portions of the upper surface of the wafer 101 that are exposed to the meniscus 111 of electroplating solution.

The apparatus of FIG. 1A also includes fluid shields 105A and 105B configured to protect the first electrode 107A and the second electrode 107B, respectively, from exposure to the meniscus 111 of electroplating solution as the anode 109 and meniscus 111 traverses thereabove. In one embodiment, each of the first and second electrodes 107A/107B is controllable to be moved away from the wafer 101 and retracted beneath its respective fluid shield 105A/105B, as the anode 109 and meniscus 111 of electroplating solution traverses thereabove.

FIG. 1B is an illustration showing an apparatus for electroplating a semiconductor wafer, in accordance with another embodiment of the present invention. The apparatus of FIG. 1B is equivalent to that of Figure of 1A with the exception that the wafer support 103, electrodes 107A/107B, and fluid shields 105A/105B are configured to be moved together in a linear direction, as indicated by arrow 117, below the anode 109 which is maintained in a fixed position. It should be understood that during operation of the apparatus of FIG. 1B, the anode 109 is oriented in a manner similar to that previously discussed with respect to FIG. 1A. Also, the electrodes 107A/107B are controlled to electrically connect to and disconnect from the wafer 101 based on the anode 109 location, as previously described with respect to FIG. 1A. It should be appreciated that since the apparatus of FIG. 1B does not require movement of equipment above the wafer 101, it is conceivable that the apparatus of FIG. 1B will allow for easier prevention of unwanted foreign particle deposition on the upper surface of the wafer 101.

FIGS. 2A through 2D represent a sequence of illustrations showing operation of the apparatus for electroplating a semiconductor wafer as previously described with respect to FIG. 1A, in accordance with one embodiment of the present invention. FIG. 2A shows the apparatus shortly after initiation of the electroplating process. In FIG. 2A, the anode 109 is being traversed over the upper surface of the wafer 101. The meniscus 111 is established below the anode 109. As shown in FIG. 2A, the fluid shield 105B serves to protect the second electrode 107B from the meniscus 111 of electroplating solution as the anode 109 traverses thereabove. Also, the second electrode 107B is electrically disconnected from the wafer 101 and retained in a retracted position as the anode 109 and meniscus 111 traverses thereabove. Furthermore, the first electrode 107, positioned substantially opposite the wafer upper surface from the anode 109, is positioned to electrically connect to the wafer 101. Thus, an electric current is caused to flow through the meniscus and across the upper surface of the wafer 101 between the anode 109 and the first electrode 107A. In FIG. 2A, since the meniscus 111 is substantially confined within the volume directly below the anode 109. Also, the first electrode 107A is positioned at a sufficient distance from the anode 109 such that the first electrode 107A will not be exposed to electroplating solution.

FIG. 2B shows the apparatus as the anode 109 continues to traverse over the wafer 101 from the position depicted in FIG. 2A. The first electrode 107A remains connected to the wafer 101 as the anode 109 traverses away from the second electrode 107B toward the first electrode 107A. In one embodiment, the second electrode 107B is maintained in the retracted position until the anode 109 and meniscus 111 is a sufficient distance away from the second electrode 107B to ensure that the second electrode is not exposed to the electroplating solution.

Also, connection of the first electrode 107A and the second electrode 107B to the wafer 101 is managed to optimize a current distribution present at the portion of the upper surface of the wafer 101 that is in contact with the meniscus 111. In one embodiment, it is desirable to maintain a substantially uniform current distribution at an interface between the meniscus 111 and the wafer 101 as the anode 109 traverses over the wafer 101. It should be appreciated, that maintaining the anode 109 a sufficient distance away from the connected electrode, i.e., the cathode, allows the current distribution at the interface between the meniscus 111 and the wafer 101 to be more uniformly distributed. Thus, in one embodiment, transition from connection of the first electrode 107A to connection of the second electrode 107B occurs when the anode 109 is substantially near a centerline of the upper surface of the wafer 101, wherein the centerline is oriented to be perpendicular to a traversal direction of the anode 109.

During transition from connection of the first electrode 107A to connection of the second electrode 107B, the connection of the first electrode 107A to the wafer 101 is maintained until the second electrode 107B is connected. Once the second electrode 107B is connected, the first electrode is disconnected from the wafer 101. Maintaining at least one electrode connected to the wafer 101 serves to minimize a potential for gaps or deviations in material deposition produced by the electroplating process.

FIG. 2C shows the apparatus following transition from connection of the first electrode 107A to connection of the second electrode 107B, as the anode 109 continues to traverse over the wafer 101 toward the first electrode 107A. The second electrode 107B is shown connected to the wafer 101. The first electrode 107A is shown disconnected from the wafer 101 and retracted beneath the fluid shield 105A to be sheltered from the approaching meniscus 111 of electroplating solution. The electric current flows through the meniscus 111 and across the upper surface of the wafer 101 between the anode 109 and the second electrode 107B.

FIG. 2D shows the apparatus as the anode 109 nears completion of its traversal over the wafer 101 near the first electrode 107A. The fluid shield 105A serves to protect the first electrode 107A from the meniscus 111 of electroplating solution as the anode 109 traverses thereabove. Also, the first electrode 107A is electrically disconnected from the wafer 101 and retained in a retracted position as the anode 109 and meniscus 111 traverses thereabove.

FIG. 3A is an illustration showing a top view of the anode 109 relative to the first electrode 107A, the second electrode 107B, and the wafer 101, as previously depicted in FIG. 2B. As previously discussed, the anode 109 extends completely across the wafer 101 in the direction of its long dimension. Thus, as the anode 109 is traversed over the wafer 101, the entire upper surface of the wafer 101 will be exposed to the meniscus of electroplating solution present below the anode 109. Also, in the embodiment of FIG. 3A, the first and second electrodes 107A/107B are shown as rectangular shaped bars. However, as previously discussed, the first and second electrodes 107A/107B can be defined to have any suitable shape compatible with the electroplating process. Also, more than two electrodes can be used in the apparatus to achieve the functionality as previously described.

Figure 3B:
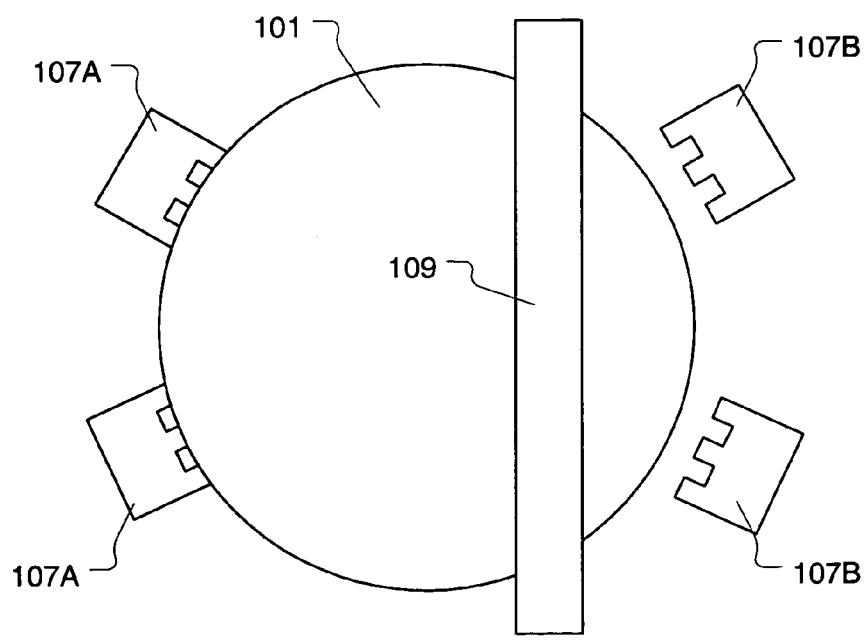
FIG. 3B is an illustration showing the apparatus of FIG. 3A in which a pair of electrodes are used to define each of the first electrode and the second electrode, in accordance with one embodiment of the present invention.

FIG. 3B is an illustration showing the apparatus of FIG. 3A in which a pair of electrodes are used to define each of the first electrode 107A and the second electrode 107B, in accordance with one embodiment of the present invention. Also, each of the electrodes shown in FIG. 3B are shown to have an alternative shape. Thus, the present invention can be implemented with multiple electrodes of varying shape so long as the multiple electrodes are disposed in a substantially opposing manner relative to a centerline of the wafer 101. Also, the present invention requires that the electrodes on each opposing side of the centerline of the wafer 101 be independently controllable with respect to contacting the wafer 101.

Figure 4A:
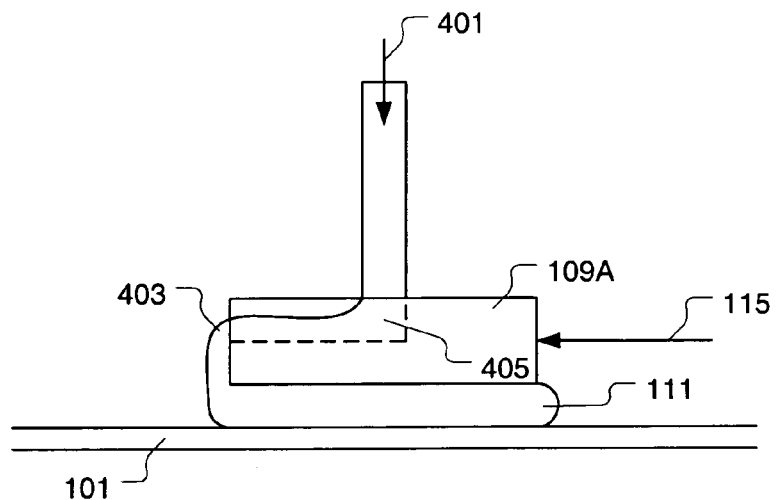
FIG. 4A is an illustration showing a solid anode traversing in a direction over the wafer, in accordance with one embodiment of the present invention.

FIG. 4A is an illustration showing a solid anode 109A traversing in a direction 115 over the wafer 101, in accordance with one embodiment of the present invention. As previously mentioned, the anode 109 can be defined as the solid anode 109A defined by a consumable anodic material. In this embodiment, the meniscus 111 of electroplating solution can be applied to the region directly below the solid anode 109A by flowing the electroplating solution around the solid anode 109A. More specifically, the electroplating solution 401 is applied through a tube to a location at top surface of the solid anode 109A. Then, the electroplating solution 401 is caused to flow through a trough 405 to a front edge of the solid anode 109A. At the front edge of the solid anode 109A, the electroplating solution 401 flows over the front edge, as indicated by callout 403, and beneath the solid anode 109A to form the meniscus 111.

Figure 4B:
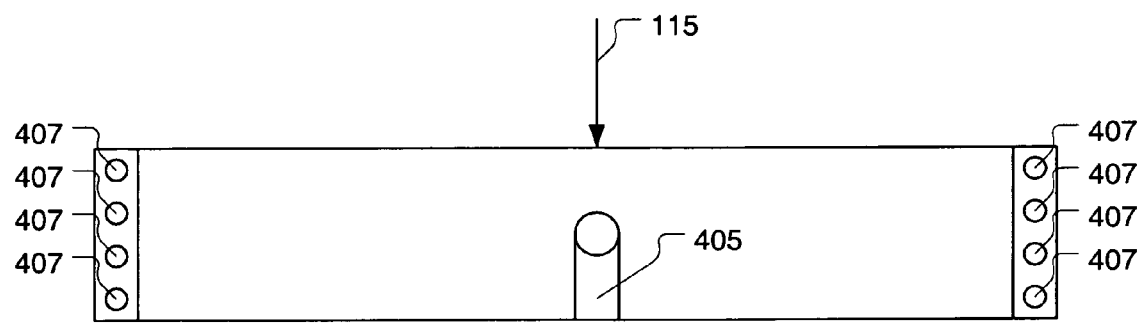
FIG. 4B is an illustration showing a top view of the solid anode described above with respect to FIG. 4A.

FIG. 4B is an illustration showing a top view of the solid anode 109A described above with respect to FIG. 4A. The trough 405 is oriented to direct the flow of electroplating solution toward the front of the solid anode 109A, wherein the front of the solid anode 109A is defined as a leading edge of the solid anode 109A relative to the direction 115 of traversal over the wafer 101. The top view of the solid anode 109A also shows vacuum orifices 407 located at the ends of the solid anode 109A. The vacuum orifices 407 serve to draw the electroplating plating solution 401 of the meniscus 111 toward the ends of the solid anode 109A. Also, the vacuum orifices 407 allow for establishment of a flow of electroplating solution 401 through the meniscus 111 region while maintaining containment of the electroplating solution 401 within the meniscus 111 region. It should be understood, however, that the present invention envisages other methods for applying and managing the electroplating solution 401 within the meniscus 111 region when using the solid anode 109A, beyond those explicitly described herein. The principles of the present invention remain the same regardless of the specific method used to apply and manage the electroplating solution 401 within the meniscus 111 region.

Figure 5A:
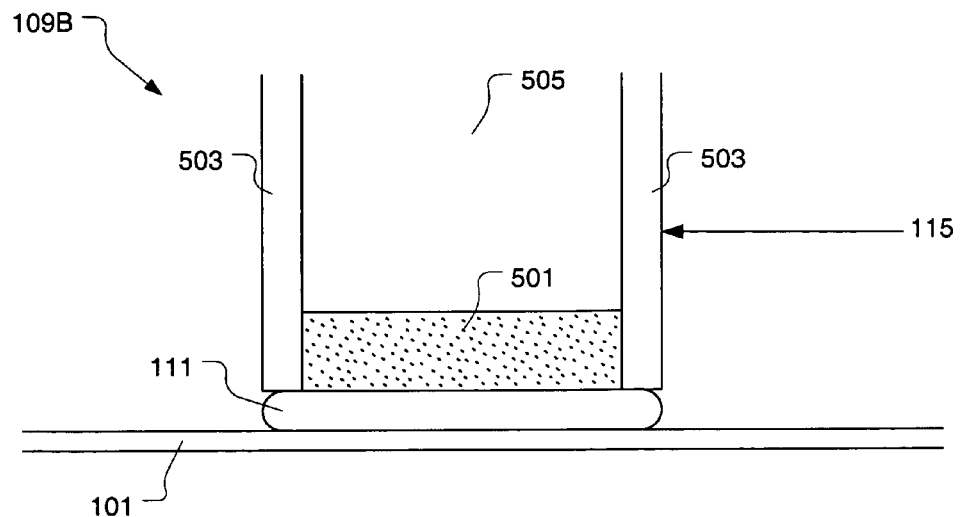
FIG. 5A is an illustration showing a virtual anode 109B traversing in a direction over the wafer, as previously mentioned in accordance with one embodiment of the present invention.

FIG. 5A is an illustration showing a virtual anode 109B traversing in a direction 115 over the wafer 101, as previously mentioned in accordance with one embodiment of the present invention. The virtual anode 109B includes a porous resistive material 501 through which a cation laden electroplating solution 505 can flow to form the meniscus 111 within the region directly below the virtual anode 109B. One or more walls 503 can be used to confine the cation laden electroplating solution 505 within a volume contacting a top side of the porous resistive material 501. In one embodiment the porous resistive material 501 can be defined by a ceramic such as $Al_2O_3$. It should be appreciated, however, that other porous resistive materials can be used in conjunction with the virtual anode 109B. A more detailed explanation of the virtual anode is provided in the related application entitled "Electroplating Cell and Method for Making the Same," which is incorporated herein by reference.

Figure 5B:
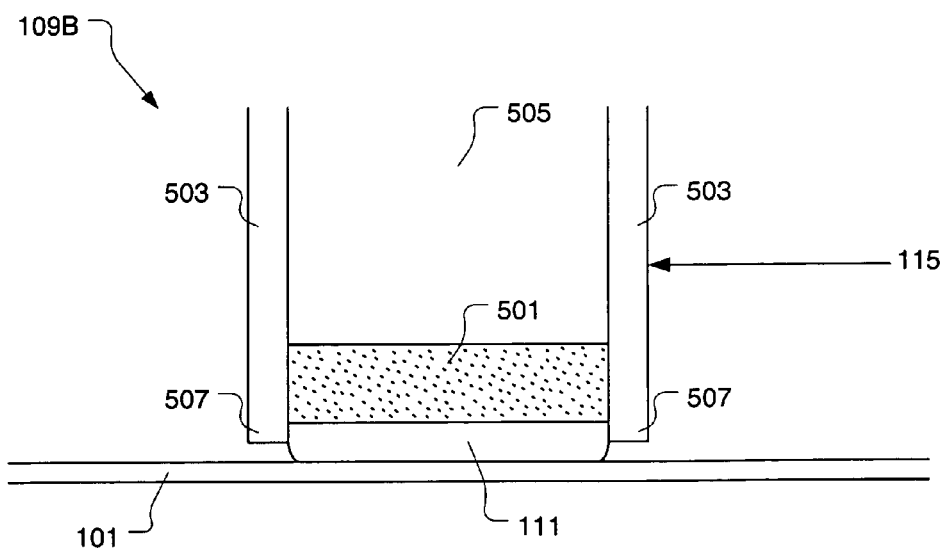
FIG. 5B is an illustration showing the virtual anode of FIG. 5A incorporating meniscus confinement surfaces, in accordance with one embodiment of the present invention.

FIG. 5B is an illustration showing the virtual anode 109B of FIG. 5A incorporating meniscus confinement surfaces 507, in accordance with one embodiment of the present invention. With respect to the virtual anode 109B, the meniscus confinement surfaces 507 represent one or more surfaces that extend below the porous resistive material toward the wafer 101. The meniscus confinement surfaces 507 are configured to assist in confining the meniscus to the region below the virtual anode 109B. The meniscus confinement surfaces 507 have been shown with respect to the virtual anode 109B for exemplary purposes. It should be appreciated that the meniscus confinement surfaces 507 can be equally implemented with the solid anode as previously described. In one embodiment, the meniscus confinement surfaces 507 can actually be defined as an integral portion of the solid anode.

A key feature of the electroplating apparatus and method of the present invention is the ability to maintain the electrodes and corresponding wafer contact surfaces in a dry condition when physically connected. An arrangement of wafer surface conditioning devices can be provided to follow the anode as it traverses over the wafer, thereby ensuring that the electrodes and corresponding wafer contact surfaces remain appropriately dry.

Figure 6:
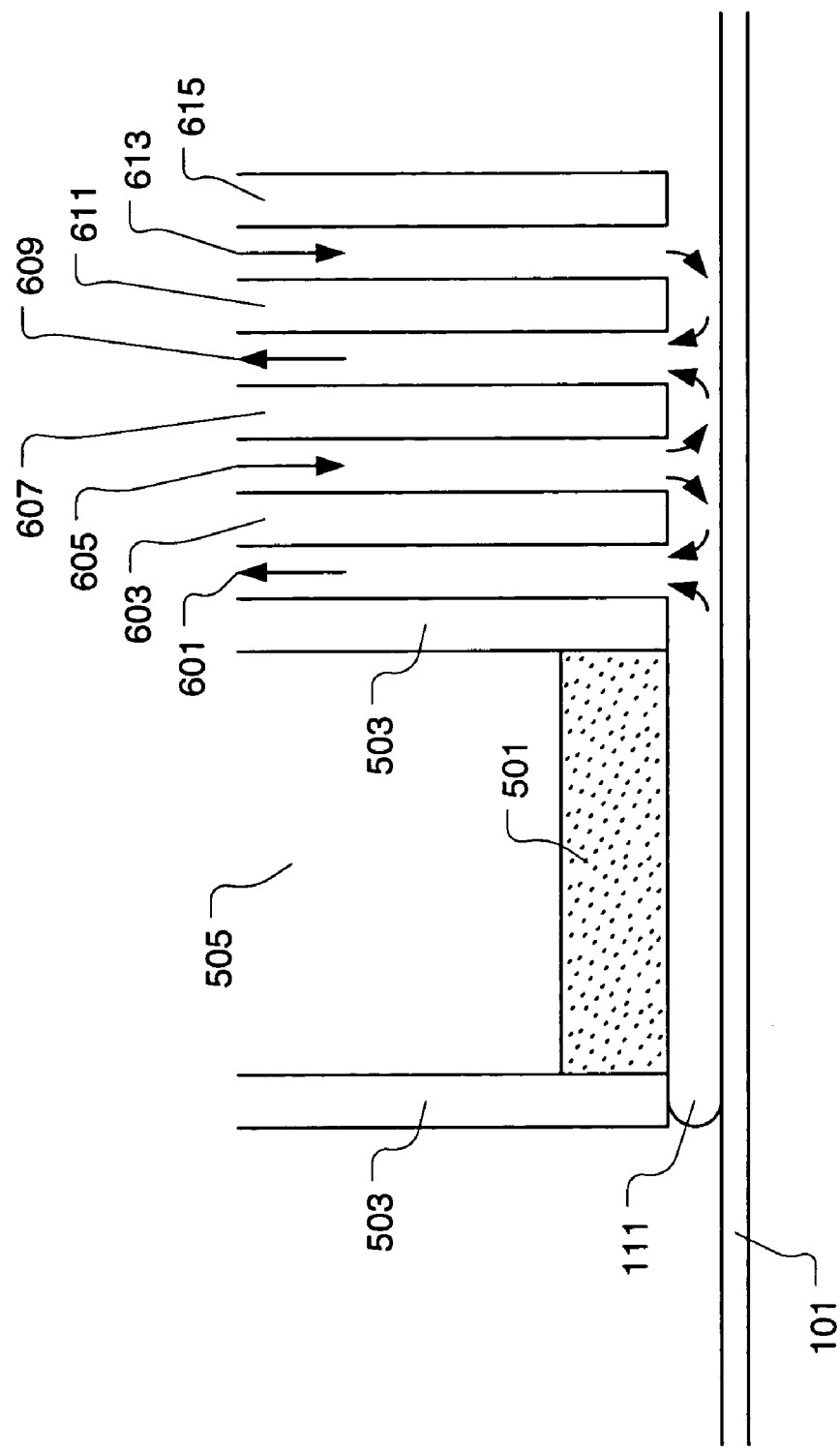
FIG. 6 is an illustration showing an arrangement of wafer surface conditioning devices configured to follow the anode as it traverses over the wafer surface, in accordance with one embodiment of the present invention.

FIG. 6 is an illustration showing an arrangement of wafer surface conditioning devices configured to follow the anode as it traverses over the wafer surface, in accordance with one embodiment of the present invention. For exemplary purposes, FIG. 6 depicts the arrangement of wafer surface conditioning devices in conjunction with the virtual anode configuration. It should be appreciated, however, that the arrangement of wafer surface conditioning devices can be equally used in conjunction with the solid anode as previously described. Each wafer surface condition device can be represented as a vent configured to apply or remove fluid from the surface of the wafer. Each vent is configured to extend along the length of the anode and be sufficient wide so as to provide an adequate fluid flow area.

With respect to FIG. 6, a first vent 601 provides a vacuum to remove fluids from the surface of the wafer following traversal of the anode thereover. A second vent 605 is separated from the first vent 601 by a wall 603. The second vent 605 provides a rinsing fluid to the surface of the wafer. In one embodiment, the rinsing fluid is deionized water. However, in other embodiments, any rinsing fluid suitable for use in wafer processing applications can be used. A third vent 609 is separated from the second vent 605 by a wall 607. Like the first vent 601, the third vent 609 provides a vacuum to remove fluids from the surface of the wafer. A fourth vent 613 is separated from the third vent 609 by a wall 611. Also, the fourth vent 613 is confined by an exterior wall 615. The fourth vent 613 can be used to apply an isopropyl alcohol (IPA)/nitrogen mixture to the wafer surface. It should be appreciated that the present invention can be implemented using wafer surface conditioning devices that include a portion of the vents described with respect to FIG. 6. Also, the present invention can be implemented using other wafer surface conditioning devices not explicitly described herein.

During the electroplating process, a uniformity of the deposited material is governed by a current distribution at an area of the wafer being plated, i.e., the interface between the meniscus of electroplating solution and the wafer. A number of factors can affect the current distribution at the area of the wafer being plated. Three primary factors affecting the current distribution include 1) location and number of electrodes contacting the wafer, 2) resistivity of the upper surface of the wafer, and 3) location and placement of the anode relative to the area being plated. By introducing a uniformly distributed resistive path, such as the porous resistive material, immediately adjacent to the cathode, i.e., the area being plated, and between the true anode and the cathode, the current flux is uniformly distributed between the uniformly distributed resistive path and the cathode. Also, by selecting a porous resistive material having a sufficiently large resistance, the effect due to resistivity of the upper surface of the wafer, particularly at the wafer edges, can be decoupled and minimized, thereby improving the uniformity of the subsequent plating process.

Conventional electroplating systems that are configured to provide simultaneous full-wafer plating are unable to plate very resistive barrier films on the wafer surface without a having a low-resistance intermediate film previously applied to the wafer. For example, in the case of Cu plating over a very resistive barrier film, the conventional system requires a PVD Cu seed layer to be applied prior to the full-wafer electroplating process. Without this seed layer, a resistance drop across the wafer will induce a bipolar effect during the full-wafer plating. The bipolar effect results in de-plating and etching within a region adjacent to electrodes contacting the wafer. Also, the conventional full-wafer electroplating system requires uniformly distributed electrodes about the periphery of the wafer, wherein a resistance for each of the uniformly distributed electrodes is matched. In the conventional full-wafer electroplating system, the presence of an asymmetric contact resistance from one electrode to another will cause a non-uniform current distribution across the wafer, thus resulting in a non-uniform material deposition across the wafer.

The electroplating apparatus of the present invention as described herein solves the problems described above with respect to the convention full-wafer electroplating system. More specifically, the apparatus of the present invention enables the electrodes to remain dry when contacting the wafer. When the bar-shaped anode of the present invention traverses the wafer, the electrode(s) can be made to contact highly resistive portions of the wafer surface away from the anode. Thus, the electric current present at the cathode, i.e., the area being plated beneath the anode, will be uniformly distributed. Also, the dry electrode contact approach essentially eliminates the potential for bipolar effects.

Figure 7:
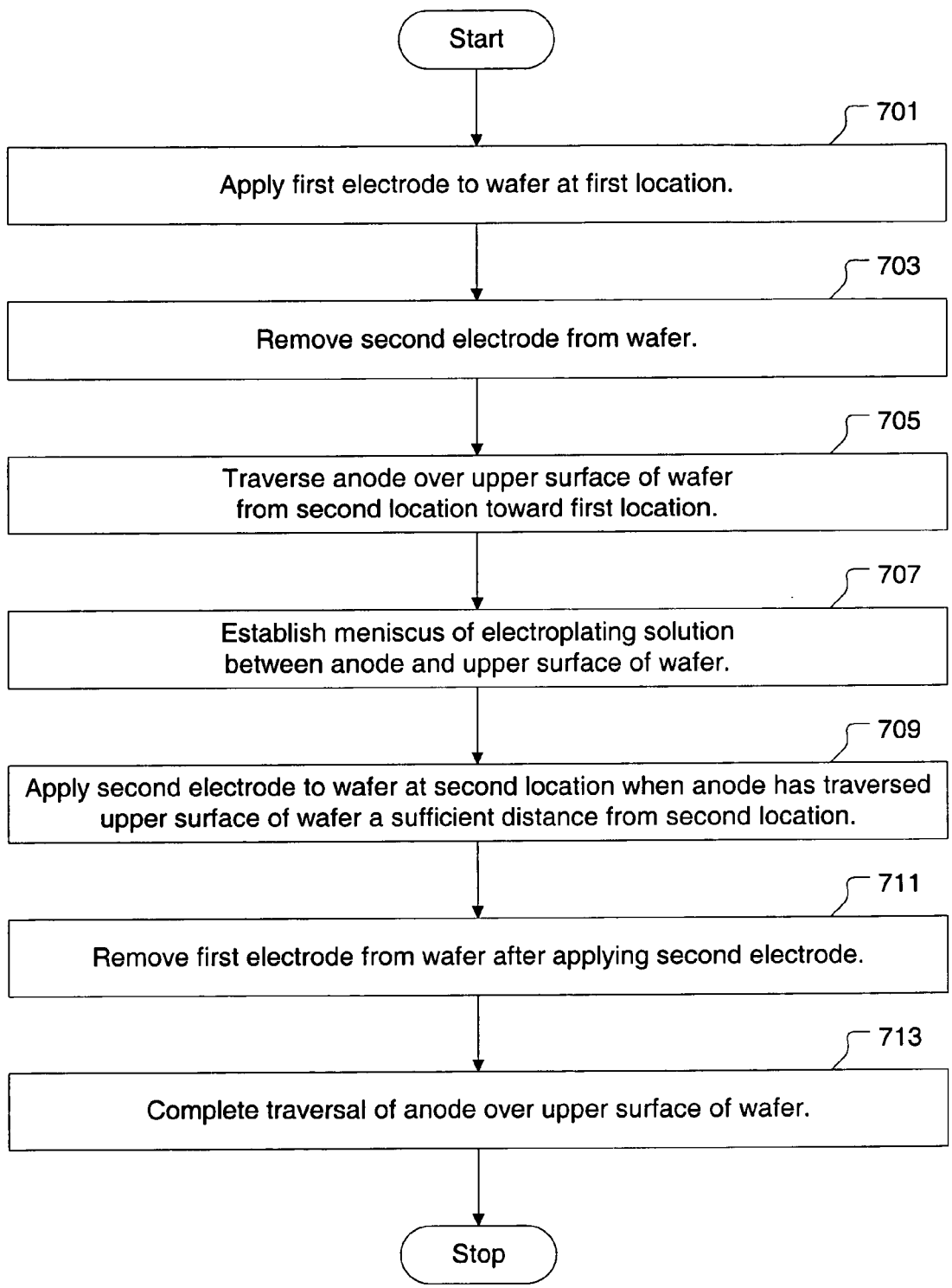
FIG. 7 is an illustration showing a flowchart of a method for electroplating a semiconductor wafer, in accordance with one embodiment of the present invention.

FIG. 7 is an illustration showing a flowchart of a method for electroplating a semiconductor wafer, in accordance with one embodiment of the present invention. The method includes an operation 701 in which a first electrode is applied to a wafer at a first location. In an operation 703, a second electrode is removed from the wafer at a second location. The second location is opposed to the first location relative to a centerline extending across the upper surface of the wafer. The method also includes an operation 705 for traversing an anode over an upper surface of the wafer from the second location toward the first location. In one embodiment, the traversing is accomplished by holding the anode in a fixed position while moving the wafer. In another embodiment, the traversing is accomplished by holding the wafer in a fixed position while moving the anode. In an operation 707, a meniscus of electroplating solution is established between the anode and the upper surface of the wafer, whereby an electrical current flows through the meniscus between the anode and the first electrode. The meniscus is confined between the anode and the upper surface of the wafer as the anode traverses over the upper surface of the wafer.

The method further includes another operation 709 for applying the second electrode to the wafer at the second location when the anode has traversed the upper surface of the wafer a sufficient distance from the second location. Once the second electrode is applied to the second location, the electrical current flows through the meniscus between the anode and the second electrode. In one embodiment, the sufficient distance from the second location is defined to maintain an adequate current density distribution at the meniscus. The sufficient distance from the second location is also defined to ensure that each of the first and second electrodes remain dry with respect to the meniscus of electroplating solution. The method continues with an operation 711 in which the first electrode is removed from the wafer after applying the second electrode. Then, in an operation 713, traversal of the anode over the upper surface of the wafer is completed.

In one embodiment, removing each of the first and second electrodes from the wafer includes position each of the respective electrodes under a fluid shield. The fluid shield serves to protect each of the first and second electrodes from the meniscus of electroplating solution. Also, in another embodiment, the method can include an operation for rinsing a portion of the upper surface of the wafer having been immediately traversed by the anode. Then, an operation can be performed to dry the portion of the upper surface of the wafer having been rinsed.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. An apparatus for electroplating a semiconductor wafer, comprising:
a wafer support having a top surface configured to hold a wafer;
a first electrode disposed at a first location proximate to a periphery of the wafer support, wherein the first electrode is configured to move through a range of motion extending between a first position above and proximate to the top surface of the wafer support and a second position outside a perimeter of the top surface of the wafer support, such that an entirety of the first electrode at the second position is located outside a vertically projected region within the perimeter of the top surface of the wafer support;
a second electrode disposed at a second location proximate to the periphery of the wafer support, the second location being substantially opposite from the first location of the first electrode relative to the top surface of the wafer support, wherein the second electrode is configured to move through a range of motion extending between a third position above and proximate to the top surface of the wafer support and a fourth position outside the perimeter of the top surface of the wafer support, such that an entirety of the second electrode at the fourth position is located outside the vertically projected region within the perimeter of the top surface of the wafer support; and
an anode disposed over the top surface of the wafer support, the anode having a rectangular surface area defined to be substantially parallel with and proximate to the top surface of the wafer support, the rectangular surface area having a long dimension that is at least equal to a diameter of the wafer to be held on the top surface of the wafer support, the rectangular surface area further defined by a second dimension that is less than the diameter of the wafer to be held on the top surface of the wafer support,
wherein the anode and the wafer support are configured to move with respect to one another in a linear direction such that the anode linearly traverses over an entirety of a diametric chord extending through a center of the top surface of the wafer support between the first electrode and the second electrode, and
wherein the proximity of the rectangular surface area of the anode to the upper surface of the wafer is sufficiently close to allow the rectangular surface area of the anode to contact a meniscus of electroplating solution to be applied to the upper surface area of wafer.

2. An apparatus for electroplating a semiconductor wafer as recited in claim 1, wherein contact between the rectangular surface area of the anode and the meniscus allows an electric current to flow through the meniscus to either the first electrode or the second electrode having been moved to be electrically connected to the wafer.

3. An apparatus for electroplating a semiconductor wafer as recited in claim 1, further comprising:
a first fluid shield configured to protect the first electrode from exposure to the meniscus of electroplating solution when the first electrode is moved to the second position; and
a second fluid shield configured to protect the second electrode from exposure to the meniscus of electroplating solution when the second electrode is moved to the fourth position.

4. An apparatus for electroplating a semiconductor wafer as recited in claim 1, wherein the rectangular surface area of the anode is defined by a porous resistive material configured to allow a flow through of cation laden electroplating solution to form the meniscus of electroplating solution on the surface of the wafer.

5. An apparatus for electroplating a semiconductor wafer as recited in claim 1, wherein the rectangular surface area of the anode is defined by a consumable anodic material.

6. An apparatus for electroplating a semiconductor wafer as recited in claim 1, wherein the anode is configured to remain in a fixed position and the wafer support is configured to move relative to the anode.

7. An apparatus for electroplating a semiconductor wafer as recited in claim 1, wherein the wafer support is configured to remain in a fixed position and the anode is configured to move relative to the wafer support.

8. An apparatus for electroplating a semiconductor wafer, comprising:
a wafer support having a top surface configured to hold a wafer;
a first electrode disposed at a first location proximate to a periphery of the wafer support, the first location residing along a first peripheral half of the wafer support, wherein the first electrode is configured to move through a range of motion extending between a first position above and proximate to the top surface of the wafer support and a second position outside a perimeter of the top surface of the wafer support, such that an entirety of the first electrode at the second position is located outside a vertically projected region within the perimeter of the top surface of the wafer support;
a second electrode disposed at a second location proximate to the periphery of the wafer support, the second location residing along a second peripheral half of the wafer support that is exclusive of the first peripheral half of the wafer support, wherein the second electrode is configured to move through a range of motion extending between a third position above and proximate to the top surface of the wafer support and a fourth position outside a perimeter of the top surface of the wafer support, such that an entirety of the second electrode at the fourth position is located outside the vertically projected region within the perimeter of the top surface of the wafer support; and
an anode disposed over the top surface of the wafer support, the anode having a rectangular surface area defined to be substantially parallel with and proximate to the top surface of the wafer support, the rectangular surface area having a long dimension that is at least equal to a diameter of the wafer to be held on the top surface of the wafer support, the rectangular surface area further defined by a second dimension that is less than the diameter of the wafer to be held on the top surface of the wafer support, wherein the anode and the wafer support are configured to move with respect to one another in a linear direction such that the anode linearly traverses over an entirety of a diametric chord extending through a center of the top surface of the wafer support between the first electrode and the second electrode, and wherein the proximity of the rectangular surface area of the anode to the upper surface of the wafer is sufficiently close to allow the rectangular surface area of the anode to contact a meniscus of electroplating solution to be applied to the upper surface area of wafer.

9. An apparatus for electroplating a semiconductor wafer as recited in claim 8, wherein contact between the rectangular surface area of the anode and the meniscus allows an electric current to flow through the meniscus to either the first electrode or the second electrode having been moved to electrically contact the wafer.

10. An apparatus for electroplating a semiconductor wafer as recited in claim 8, further comprising:
   a first fluid shield configured to protect the first electrode from exposure to the meniscus of electroplating solution when the first electrode is moved to the second position; and
   a second fluid shield configured to protect the second electrode from exposure to the meniscus of electroplating solution when the second electrode is moved to the fourth position.

11. An apparatus for electroplating a semiconductor wafer as recited in claim 8, wherein the rectangular surface area of the anode is defined by a porous resistive material configured to allow a flow through of cation laden electroplating solution to form the meniscus of electroplating solution on the surface of the wafer.

12. An apparatus for electroplating a semiconductor wafer as recited in claim 8, wherein the rectangular surface area of the anode is defined by a consumable anodic material.

13. An apparatus for electroplating a semiconductor wafer as recited in claim 8, wherein the anode is configured to remain in a fixed position and the wafer support is configured to move relative to the anode.

14. An apparatus for electroplating a semiconductor wafer as recited in claim 8, wherein the wafer support is configured to remain in a fixed position and the anode is configured to move relative to the wafer support.

15. A semiconductor wafer electroplating system, comprising:
   a wafer support structure having a top surface configured to hold a wafer;
   an anode disposed over the top surface of the wafer support structure, the anode configured to linearly traverse over an entirety of the top surface of the wafer support structure from a first location to a second location, each of the first location and the second location being proximate to and outside a periphery of the wafer support structure, the anode being further configured to contact a meniscus of electroplating solution between a horizontal surface of the anode and an upper surface of the wafer to be held by the wafer support structure, the horizontal surface of the anode having a rectangular area extending along a first chord defined across the top surface of the wafer support structure, wherein the first chord is substantially perpendicular to a second chord extending from the first location to the second location across the top surface of the wafer support structure;
   a first electrode configured to move through a range of motion extending between a first position above and proximate to the top surface of the wafer support and a second position outside the periphery of the wafer support structure, wherein the first position is set to cause the first electrode to electrically contact the wafer to be held on the top surface of the wafer support structure, wherein an entirety of the first electrode at the second position is located outside a vertically projected region within the periphery of the wafer support structure; and
   a second electrode configured to move through a range of motion extending between a third position above and proximate to the top surface of the wafer support and a fourth position outside the periphery of the wafer support structure, wherein the third position is set to cause the second electrode to electrically contact the wafer to be held on the top surface of the wafer support structure, wherein an entirety of the second electrode at the fourth position is located outside the vertically projected region within the periphery of the wafer support structure.

16. A semiconductor wafer electroplating system as recited in claim 15, wherein the meniscus of electroplating solution is confined to a region between the horizontal surface of the anode having the rectangular area and the upper surface of the wafer.

17. A semiconductor wafer electroplating system as recited in claim 15, wherein the rectangular area is defined by a long dimension that is at least equal to a diameter of the wafer, the rectangular area being further defined by a second dimension that is less than the diameter of the wafer.

18. A semiconductor wafer electroplating system as recited in claim 15, wherein contact between the anode and the meniscus of electroplating solution allows an electric current to flow through the meniscus of electroplating solution to either the first electrode or the second electrode having been moved to electrically contact the wafer.

19. A semiconductor wafer electroplating system as recited in claim 15, further comprising:
   a first fluid shield configured to protect the first electrode from exposure to the meniscus of electroplating solution when the first electrode is moved to the second position; and
   a second fluid shield configured to protect the second electrode from exposure to the meniscus of electroplating solution when the second electrode is moved to the fourth position.

20. A semiconductor wafer electroplating system as recited in claim 15, wherein the horizontal surface of the anode having the rectangular area is defined by a porous resistive material configured to allow a flow through of cation laden electroplating solution to form the meniscus of electroplating solution.

21. A semiconductor wafer electroplating system as recited in claim 15, wherein the horizontal surface of the anode having the rectangular area is defined by a consumable anodic material.

22. A semiconductor wafer electroplating system as recited in claim 15, wherein the anode is configured to remain in a fixed position and the wafer support is configured to move relative to the anode.

23. A semiconductor wafer electroplating system as recited in claim 15, wherein the wafer support is configured to remain in a fixed position and the anode is configured to move relative to the wafer support.

* * * * *